United States Patent [19]
Cao et al.

[11] Patent Number: 5,635,761
[45] Date of Patent: Jun. 3, 1997

[54] INTERNAL RESISTOR TERMINATION IN MULTI-CHIP MODULE ENVIRONMENTS

[75] Inventors: Tai A. Cao, Austin, Tex.; Herbert I. Stoller, Wappingers Falls, N.Y.; Thanh D. Trinh; Lloyd A. Walls, both of Austin, Tex.

[73] Assignee: International Business Machines, Inc., Armonk, N.Y.

[21] Appl. No.: 355,876

[22] Filed: Dec. 14, 1994

[51] Int. Cl.$^6$ ................................................ H01L 23/053
[52] U.S. Cl. ........................ 257/700; 257/684; 257/693; 257/698; 257/705; 257/707; 257/760
[58] Field of Search ............................. 257/684, 690, 257/691, 693, 698, 700, 705, 707, 760

[56] References Cited

U.S. PATENT DOCUMENTS 4,811,082  3/1989  Jacobs et al. ........................ 257/684
5,093,587  3/1992  Zbinden ............................... 257/684
5,412,539  5/1995  Elwell et al. ........................ 257/684

Primary Examiner—Edward Wojciechowicz
Attorney, Agent, or Firm—Laurence R. Letson

[57] ABSTRACT

Thin-film conductor technology is utilized to form resistors of precisely controlled value within the interior of multi-chip modules to properly terminate network circuits which interconnect one or more chips with either output pin connections or other chips on the multi-chip module. By forming and disposing the resistors within the interior of the multi-chip module, the terminating resistors may be manufactured during the multi-chip module manufacturing process. This approach preserves valuable surface area available for interconnecting the computer chips to the multi-chip module rather than consuming scarce surface area with termination resistors and other circuit elements necessary to adapt the multi-chip module and the other computer chips to each other.

19 Claims, 5 Drawing Sheets

INTERNAL RESISTOR TERMINATION IN MULTI-CHIP MODULE ENVIRONMENTS

FIELD OF THE INVENTION

This invention relates to multi-chip modules, as used in computer systems and the like, and more specifically to the fabrication of a multi-chip module to support and use the same chips that are designed for use on a single chip module through internal thin-film termination techniques.

BACKGROUND OF THE INVENTION

Computer chips are designed and optimized for use on either a single chip module or a multi-chip module but the optimization characteristics of each chip are different for use on each type of module. The optimization of the particular computer chip is accomplished by properly balancing the requirements for the computer chip with each requirement for either the single or multiple chip module. The choice as to the optimization is dictated to a large extent by the characteristics and requirements of the module to be used with the chip output driver. The specific consideration being addressed by this invention is the relative signal strength delivered from the chip drivers. Since the on-chip driver is designed for the particular module or card environment in which it is to be used, the driver is fixed and the driver characteristics are determined at the time of design and manufacture of the processor chip.

As optimized for use on a single chip module the chip driver provides a much stronger drive signal than the drive signal which would emanate from a processor chip optimized for use on a multi-chip module. If a chip that is optimized for single chip module use is used on a multi-chip module, its signal strength is sufficient to overdrive the transmission line leading to the receiver, but this will cause undesirable signal reflections at the receiver and the driver. The reflection at the driver end of the transmission line will return again to the receiver and appear as a false signal. Reflections will continue traveling back and forth until the signal amplitude dissipates. Signal reflections and overdriving are undesirable characteristics which, of necessity, must be addressed during the design phase.

Because a chip mounted on a single chip module is optimized for its module and for further interconnection of that module to other modules over significant distances, the signal strength is matched to the transmission line and associated circuitry and no special circuit modifications are necessary since the processor chip is tailored or designed for that specific implementation.

Whenever the circuit designer makes the choice as to which chip driver design is to be used, that chip is optimized for a specific environment thereby becoming the standard chip. The decision is primarily driven by economics. The quantity of chips which are used in each module environment is significantly different and the design parameters of the chips vary depending on the module design. Single chip module usage is much more common; and accordingly, with other factors being generally equal, the economics suggest the single chip module optimized chip is best selected for both uses. Secondarily, the strength of the driver signals for a single chip module optimized chip is easier to work with and modify when implemented on a multiple chip module than the modification of the signal strength for a multiple chip module chip when implemented on a single chip module.

Accordingly, other factors being generally equal, the economics of manufacturing and the manufacturing efficiencies associated with higher volumes tend to dictate that the processor chip optimized for a single chip module be selected for use on a multiple chip module, and additionally that the multiple chip module thereby be designed to accept and satisfactorily operate with the selected processor chip. The incremental cost of designing the multi-chip module to accept single module chips is relatively small because the interconnection circuits internal to the module must be designed for whatever computer chip is selected and only optimization of selected connections in the module is affected.

Once such a selection between the two chips is made, the support circuitry of the multi-chip module must be designed to accommodate the slightly less than optimal chip parameters selected for use therewith.

As a computer chip optimized for use with single chip modules is selected for use with multiple chip modules one of the problems to be addressed is that the driver signal of the selected chip will overdrive the circuit and produce significant signal overshoot and undershoot, thereby resulting in unreliable signals and generating unwanted and undesired reflections of the signals from unterminated networks. These undesirable characteristics may be satisfactorily addressed by connecting termination resistors at appropriate points in the circuit, most typically in series with the conductor and the driver to create a near end termination; nevertheless, other connection points for the termination resistors are known and may be considered for termination purposes.

Because end termination resistors typically would be resident at the driving or receiving chip, extreme surface congestion can occur near the chip. The available space for surface mount resistors is extremely limited in the chip mount region due to the large number of interconnections near the chips. Accordingly, the positioning of termination resistors between the contact pad on the multi-chip module and the contact of the driven processor chip becomes impractical from a space and volume requirements standpoint.

Whenever the need for such resistors is considered, if there is a need for several of the connections involving termination resistors, the space surrounding the chip is insufficient to support the wiring of the resistors. In order to accommodate the resistors, the size of the multi-chip modules would have to be significantly expanded; this expansion and corresponding displacement of the processor chips away from each other, to afford space needed for and to accommodate the termination resistors, defeats some of the advantages of the multi-chip module, close proximity placement for the various processor chips attached thereto.

In disposing the computer chips over a larger surface area on a multiple chip module, the efficiencies and speed acquired by the use of the multi-chip module are partially offset or defeated; and accordingly, any advantage of the multi-chip module over several single chip modules would be no longer significant if present at all.

One embodiment of multi-chip modules involves the use of multi-layered ceramic (MLC) technology. This invention will be described with reference to this technology, although the extension to other embodiments i.e., laminated boards, is within the skill of the art.

In MLC technology, a given circuit configuration is implemented as a set of conductors screened onto an insulating substrate layer. The conductors on each layer may be interconnected to conductors on other layers through the use of vias (holes created in layers and filled with conductive materials).

The processing sequence for MLC manufacturing is:

1) create a pre-ceramic sheet of material which, when sintered or fired will become solid ceramic. The pre-ceramic sheet is referred to as a "green sheet" and it is flexible and easy to process, i.e., punch hole into it and screen material onto the sheet.

2) punch holes into the green sheet where interlayer connections will be required.

3) screen conductor containing paste onto the green sheet to form the conductive paths desired. At the same time, or separately, if desired, fill the punched holes with the paste material;

4) stack the appropriate green sheet layers (with their respective conductive patterns) and laminate them. This forces the conductive paste filled vias and layers to co-mingle forming continuous paths between layers.

5) sinter the laminated green sheets at an appropriately high temperature, causing the green sheets to form a solid ceramic structure and at the same time resulting in the conductive material containing paste forming continuous low resistance conductors.

It is possible to control the resulting resistivity of the conductors by controlling the nature of the paste being screened. Moreover, by including ceramic material in the conductive paste itself, the resistance of the resulting conductors can be altered dramatically.

It is this ability of controlling the resistance of the conductors that will be used in this invention.

Another embodiment of a multi-chip module utilizes thin-film technologies. Thin-film connections are selected to reduce the size of inter chip conductors. The resistance of a particular conductor is determined by a combination of factors, including the bulk resistivity of a material used in the thin-film conductor, the thickness of the thin-film conductor, the width of the thin-film conductor, and/or the length of the thin-film conductor. All of these factors can have an established influence on the resistance of any conductive path which may be designed for interconnecting two or more processor chips on a single substrate or module.

The conductors in the multi-chip module may be of sufficient length, lay sufficiently close enough to other conductors, and carry signals that have voltage rise and fall times that are fast enough to act as transmission lines with the well known concomitant problems associated with transmission lines, particularly signal reflections and termination requirements. Therefore, those circuits having portions acting as transmission lines which require termination in order to prevent reflected signals must have termination components incorporated therein.

Contributing to the transmission line emulation is the high speed signal transmission or the very rapid signal rise and fall times necessary for high speed signals. The signals being sent and/or received by the various chips on a multiple chip module are of extremely short duration; accordingly, the faster the rise time of a signal, the shorter a line has to be in order to mimic a transmission line. Because of the short acquisition windows, termination of a circuit in the characteristic impedance of the line is dictated in order to provide a stable, reliable signal and suppression of signal reflections.

OBJECTS OF THE INVENTION

It is an object of the invention to advantageously utilize characteristics of the thin-film technology to control impedance of selected circuits.

It is another object of the invention to advantageously utilize the characteristics of the thin-film technology, or varying paste conductivity, to permit use of electrical circuit chips optimized for one type chip module to be usable with a second type chip module.

It is another object of the invention to take advantage of the thin-film conductors or varying paste conductivity to provide the advantages of termination of the circuit without the need for separate discreet termination resistors.

It is a further object of the invention to reduce the amount of surface area necessary to accommodate the chips and related connections and components on multi-chip modules through the use of termination resistors internal to said multi-chip modules.

SUMMARY OF THE INVENTION

Integral terminating resistors are incorporated into the multi-chip module to: 1) eliminate the need for discreet resistors which take up valuable surface space on the MCM and 2) permits use of chips designed for single chip module applications to be used in multi-chip module applications.

These integral terminating resistors may form series terminations, parallel terminations or far end termination for the circuits interconnecting terminals on different chips.

The integral terminating resistors can be fabricated in two ways: 1) the resistors may be constructed using thin-film technology by tailoring the geometry appropriately, i.e., designing the width, length and height to match the resistance required, or 2) the resistors may be formed through the use of high resistivity paste in the formation of screened patterns on the green sheets prior to sintering and also controlling the length, width and height appropriately.

As desired or necessary, the thin-film resistor may be inserted between segments of low resistance, highly conductive paths which are referred to as the glass ceramic transmission lines. The thin-film resistors may be connected to the voltage plane or $V_{DD}$ and/or GND (the reference plane) to form split terminations or parallel terminations and may also be used in multi-drop networks.

The objects of the invention are accomplished, and the advantages derived while overcoming disadvantages inherent in the prior art approaches, by the instant invention through the incorporation of thin-film or high resistance paste formed terminating resistors internal to the chip module, leaving the module surface free to accommodate the computer chips with minimum surface area.

Reference to the following drawings and the detailed description of the invention will provide a more complete understanding of the invention

DETAILED DESCRIPTION OF THE BEST MODE OF THE PREFERRED EMBODIMENT FOR CARRYING OUT THE INVENTION

Figure 1:
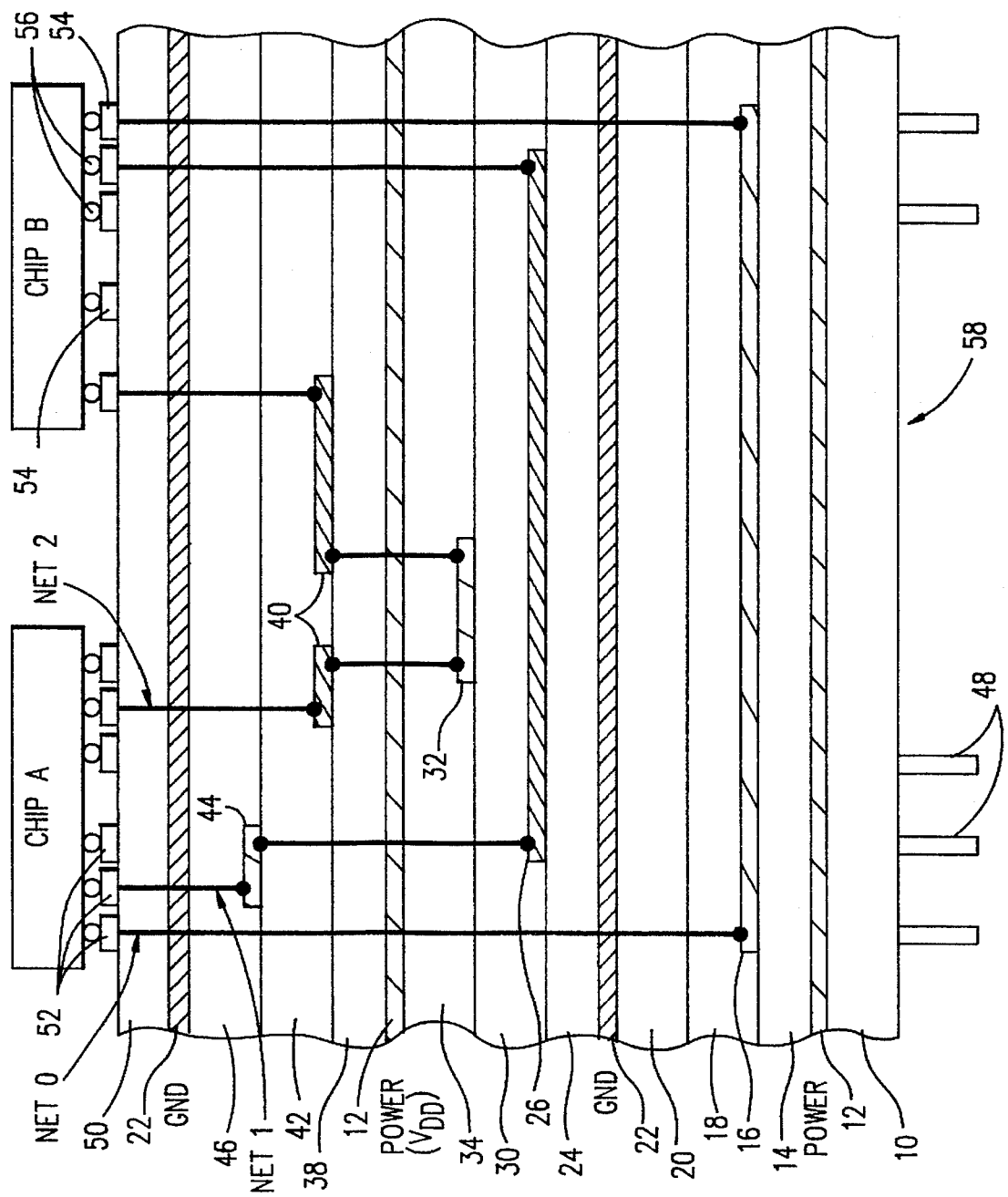
FIG. 1 is an illustration of a cross-sectional view of a ceramic or glass ceramic multi-chip module illustrating the circuit networks in FIGS. 4, 5, and 6.
Figure 2:
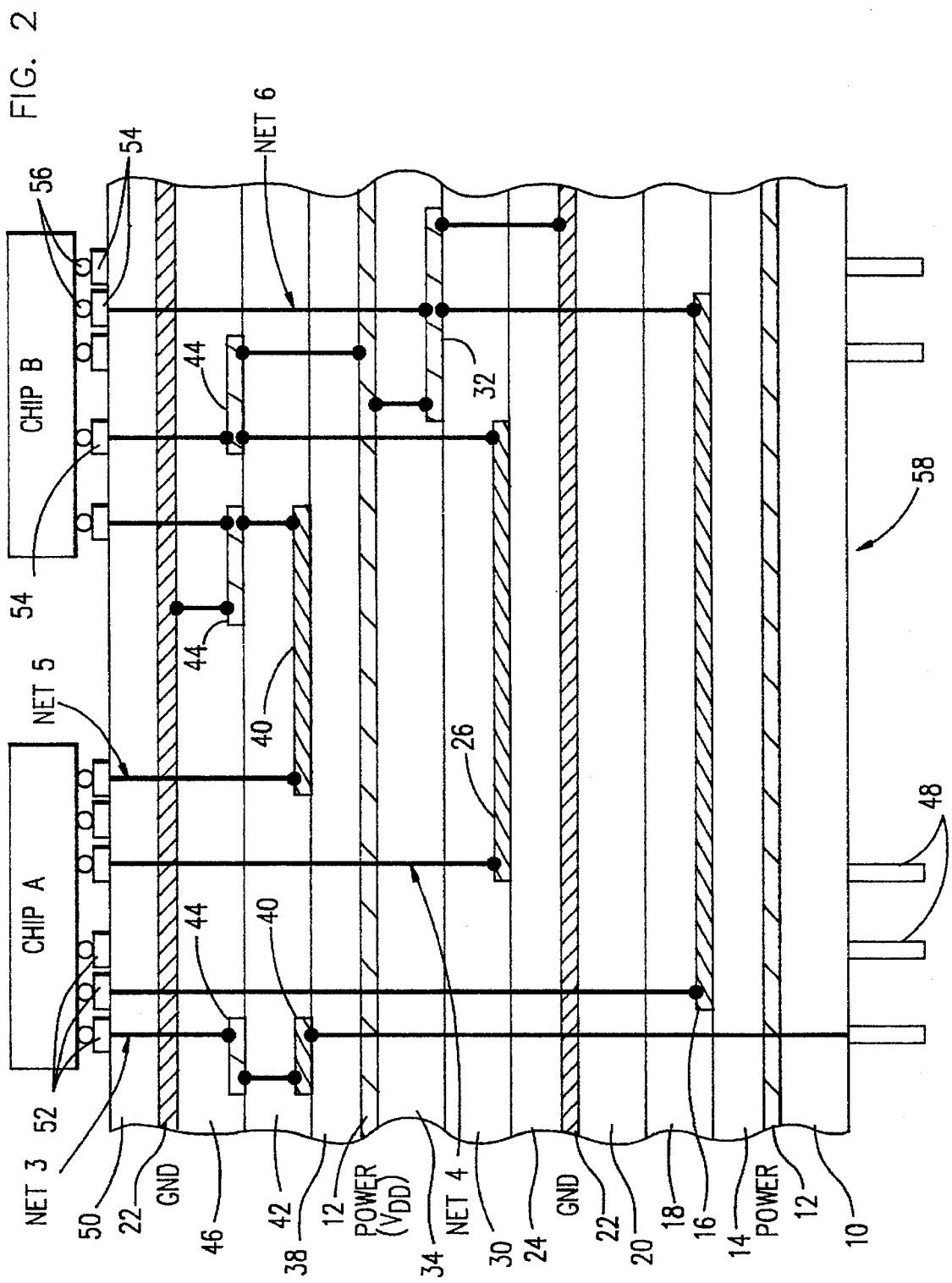
FIG. 2 is an illustration of a cross-sectional view of a ceramic or glass ceramic multi-chip module illustrating the circuit networks in FIGS. 7, 8, 9, and 10.
Figure 3:
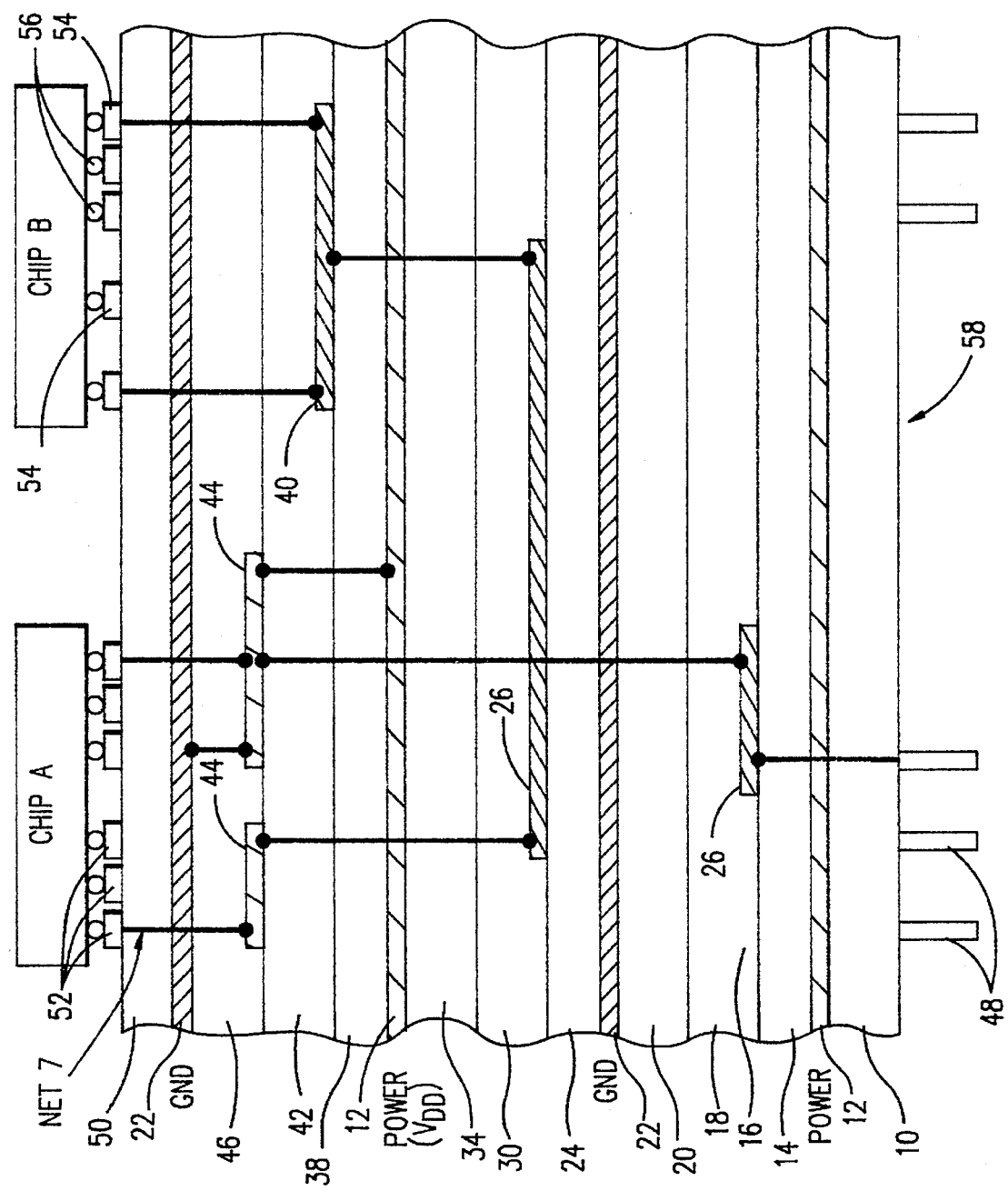
FIG. 3 is an illustration of a cross-sectional view of a ceramic or glass ceramic multi-chip module illustrating the circuit network in FIG. 11.

It is advantageous at this point to make some initial remarks about the technique of illustration in FIGS. 1, 2 and 3. As can be observed, FIGS. 1, 2 and 3 illustrate cross-sections of a portion of a multi-chip module or ceramic module for supporting and interconnecting chips A and B. Alternate layers of the module are ceramic substrates which are either conventional ceramic or glass ceramic and insulative in nature.

Disposed on and interleaved between the ceramic substrates in the module 58, illustrated in FIG. 1, 2 and 3 are patterned layers of high resistance and low resistance conductors. Also illustrated are module pins protruding from the bottom surface of the ceramic module in order to carry signals to off-module circuits.

The various layers interleaved between the ceramic layers are in reality, land patterns which are laid out on the surface of the supporting ceramic substrate and are not continuous layers and co-extensive with the entire surface of the associated supporting ceramic substrate.

It should be understood that the path for each of the respective NETS is separate and distinct from the other NET paths. No short circuits or undesired interconnections will occur even though it may appear possible from the drawings of FIGS. 1, 2 and 3.

All vertical conductive paths of the NETS illustrated are implemented by via connections extending through the respective layers of the ceramic module. The via connections illustrated are not electrically connected to any of the conductive layers through which the vias pass with the exception of those layers where the path is illustrated as changing direction from the vertical to the horizontal within a particular conductive layer or where a dot at the junction indicates a connection. In those cases, the via connection is electrically connected to that conductive layer.

The positioning of the vias and the layout of these conductive paths which form the conductive layers supported by the ceramic substrates are conventional in nature and need not be further described for purposes of this invention.

FIG. 1 illustrates a multiple chip module 58 which is made up of a plurality of layers. For layers 10, 14, 18, 20, 24, 30, 34, 38, 42, 46, and 50 all are either ceramic or glass ceramic layers which are made up of conventional ceramic materials such as aluminum nitride for a ceramic layer or aluminum oxide for a glass ceramic layer. Other conventional materials usable in this environment are intended to be included in the general description of either ceramic or glass ceramic materials.

Low resistance conductive paths 12, 16, 22, 26 and 40 are conventionally formed as patterned layers on the surfaces of the respective ceramic layers 10, 14, 24, 34, 38, 46, and 50. The low resistance conductive layers 12, 16, 22, 26 and 40 may be made of molybdenum or copper for ceramic substrates and copper for glass ceramic substrates. Other than their appropriate selection depending upon the type layer or substrate on which they are deposited, no further distinction will be made between molybdenum or copper as each performs substantially identical functions with the only difference being the nature of the supporting substrate layer.

Layers 32, and 44 are fabricated on glass ceramic sheets by using high resistivity paste or thin-film layers of aluminum or copper. The significant difference between the layer of the low resistance conductive layers 12, 16, 22, 26 40 and the high resistance in layers 32 and 44 is the higher resistivity of the material and that the conductor widths are narrowed significantly in order to induce and control the resistance to achieve a specific desired resistance for that circuit segment. The same relationships would apply if the layers forming the highly conductive, low resistance layers 12, 16, 22, 26, and 40 are made out of molybdenum for a ceramic substrate.

The pattern for the thin-film layers 32, 44 and the copper or molybdenum pattern of the low resistance thin-filmed layer 52 is photolithographically formed, preferably on a glass substrate to define the conductive pattern and form of what may be referred to as a decal. The formation of the decal on the glass substrate utilizes conventional photolithographic technology. Upon the decal being formed on the glass substrate, the glass substrate then may be turned over and placed in a face-to-face relationship with an unfired glass ceramic green sheet and exposed to laser light to cause the conductive pattern or decal to delaminate or detach from the supporting glass substrate and lay onto the surface of the green sheet. Once properly positioned and transferred onto the surface of the green sheet and transferred thereto, the conductive pattern of the thin-film material may be sandwiched with other green sheets and fired to fuse the green sheets and conductive patterns into a solid single glass ceramic or ceramic block.

Several of the low resistance conductive layers 12, 22 may be more akin to a continuous layer than the other layers forming conductive patterns and may be used as a ground, power or any other plane that is biased to a potential. These layers 12 and 22 may be generally co-extensive with the surface of the ceramic or glass ceramic green sheet supporting them with only isolations for areas where via holes will pass through the conductive planes 12, 22 without interconnecting the power/ground conductor with the via.

The conductive pads 52 for chip A and pads 54 for chip B are formed on the surface of the multi-chip module 50 of a low resistance thin-film material which advantageously may be gold in order to prevent surface corrosion and further provide excellent electrical conductivity.

In order to illustrate the various utilizations of the high resistance connections internal to the multi-chip module 58 to form proper terminations for the circuits or NETS interconnecting chip A and chip B or chip A and a pinout 48, several NETS will be described.

Figure 4:
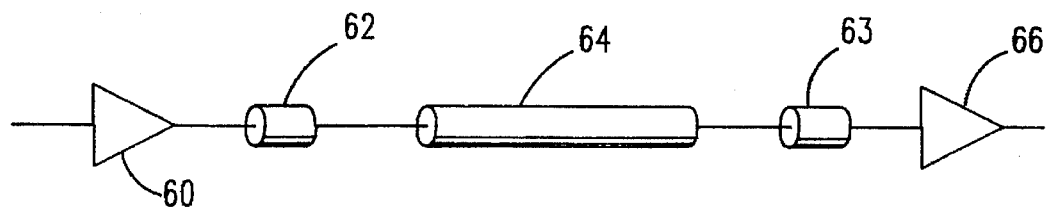
FIG. 4 is an illustration of a prior art interconnection circuit for connecting a terminal on a first electronic chip to a terminal on a second electronic chip without termination designated NET 0.

A typical prior art circuit, NET 0, for an unterminated connection wherein signal overshoot/undershoot occurs is illustrated in FIG. 4. The driver 60 on the driving chip is connected through a thin-film low resistance connection 62 (corresponding to pad 52) to a glass ceramic conductor structure 64 which corresponds, for example, to glass ceramic substrate 14 and copper layer 16 in FIG. 1. The glass ceramic conductor 64 further is connected to a thin-film, low resistance conductor 63 (corresponding to pad 54) which acts as a terminal connector for the receiver circuit 66 (located within chip B). As one may readily observe, there is no termination in the circuit of FIG. 4; therefore, whenever the signal strength being provided by driver 60 is excessive for the transmission line impedance and the other circuit characteristics, undesirable signal overshoot and undershoot and signal reflections will occur.

Figure 5:
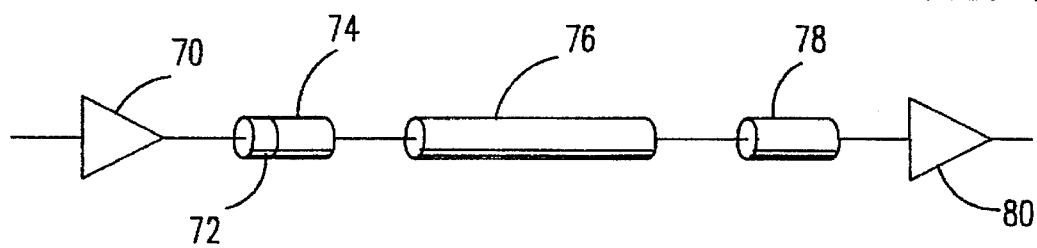
FIG. 5 is an diagrammatic representation of an interconnection circuit for connecting a terminal on a first electronic chip to a terminal on a second electronic chip, designated NET 1 in FIG. 1, using series termination.

Referring now to FIG. 5, a circuit which corresponds to NET 1 in FIG. 1 is illustrated. Driver 70, typically resident within a chip such as chip A, is connected by a low resistance thin-film connector 72, corresponding to pad 52. Low resistance, thin-film conductor 72 is associated with and connected to high resistance conductor 74, corresponding to layer 44; and the two conductors 72, 74 will have a combined length of approximately 5 cm in this example. The length and resistance of the vias illustrated by the vertical paths between chip A and B, and layers 44, 26 for NET 1 are of negligible resistance and may be ignored.

High resistance conductor 74 then is connected to the conductor 76, which corresponds to conductive layer 26, supported by glass ceramic layer 24 in FIG. 1. After transiting a sufficient length to reach a second chip B, typically approximately 10 cm or less of the conductive layer 26, the electrical path is via connected back to low resistance thin-film conductor 78 corresponding to layer 54 of FIG. 1 and terminated at chip B on a terminal for receiver 80. The thin-film conductor 78 (layer 54), being approximately 0.2 cm in length, is used to assure proper alignment between the conductive pads 54 for chip B and an associated via connection extending into the conductive layer 26.

The resistance introduced by the high resistance conductor 74 or resistor (layer 44 in FIG. 1), is one form of series termination for the circuit and thus helps to insure that there is no overshoot or undershoot of the signal as well as eliminates reflected signals.

Figure 6:
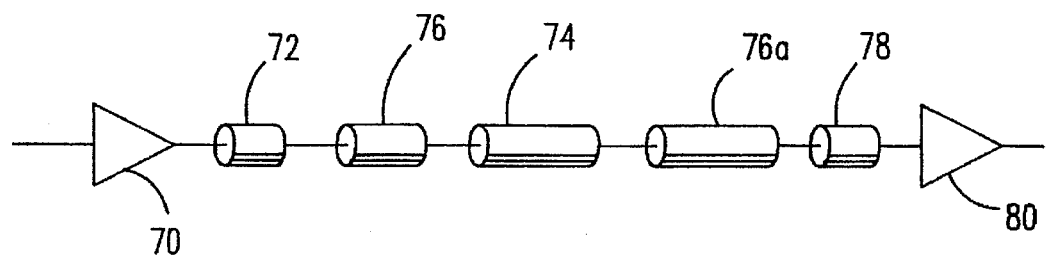
FIG. 6 is a diagrammatic illustration of an interconnection circuit for connecting a terminal on a first electronic chip to a terminal on a second electronic chip, designated NET 2 in FIG. 1, using series termination.

Refer now to FIG. 6 which illustrates a diagrammatic representation of a circuit corresponding to NET 2 in FIG. 1, the short conductor 76 and long conductor segment 76a, corresponding to layer 40, are separated by a high resistance resistor 74, corresponding to layer 32, which is connected between the segments of the glass ceramic low resistance, conductors 76, 76a. In other regards, the connectors 72 and 78 generally are described above with respect to NET 1 in FIG. 5.

The output signal from thin-film conductor 78 is connected to receiver 80. This arrangement provides a series termination of the circuit. This arrangement may be necessary to avoid over crowding of patterns on the more desirable and accessible upper levels of high resistance layer 44. A short segment of a low resistance thin film conductor may be needed to align to patterns in layer 32.

Figure 7:
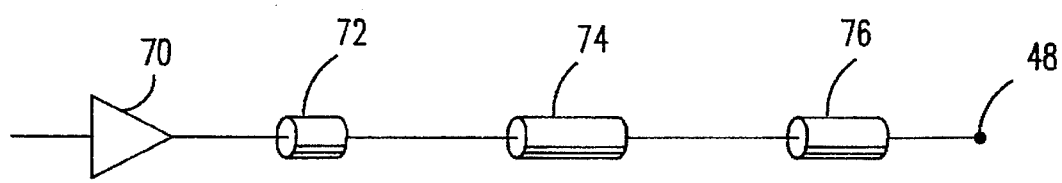
FIG. 7 is an illustration of an interconnection circuit for connecting a terminal on a first electronic chip to a module pin, designated NET 3 in FIG. 2, using series termination.

NET 3 of FIG. 2 is diagrammatically illustrated in FIG. 7 where an off-module NET connection is illustrated. NET 3 is substantially identical in construction and structure to that of NET 1 with the exception that the final thin-film low resistance conductor 78 in NET 1, FIG. 3, is eliminated and the output of the glass ceramic conductor 76, corresponding to low resistance conductor layer 40, is directed to module pin 48 to provide the signal of driver 70 to an off-module connection (not shown). This illustrated arrangement is also a series termination for the circuit.

Figure 8:
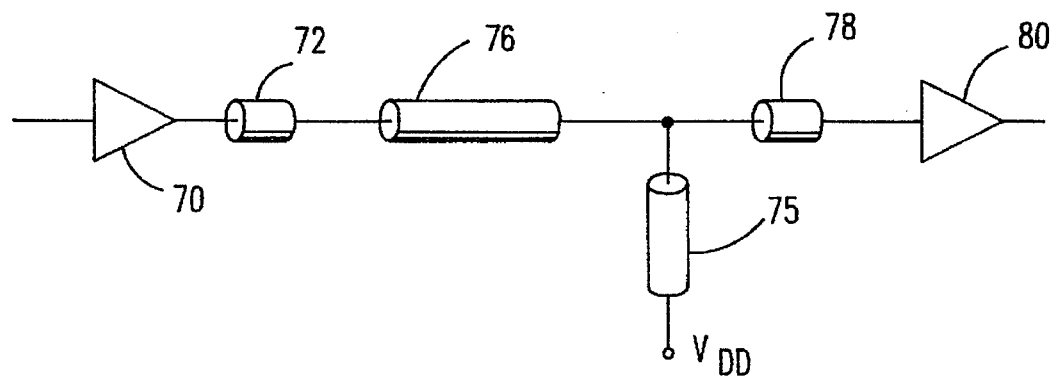
FIG. 8 is an illustration of an interconnection circuit for connecting a terminal on a first electronic chip to a terminal on a second electronic chip, designated NET 4 in FIG. 2, using parallel termination wherein the resistor is connected to a power plane.

Referring to FIG. 8, NET 4 originally shown in FIG. 2 is illustrated in diagrammatic form. In this instance, driver 70 is connected to a glass ceramic conductor 76, corresponding to layer 26. Layer 26 then may be tapped at a far end and connected to a resistor 75, corresponding to layer 44. The output connection of resistor 75 may be connected to a conductive layer 12 or other conductive layer which acts as either a voltage source $V_{DD}$ or ground. Although not illustrated in FIG. 8, the terminating resistor 75 may be connected to ground if desired. The far end of the glass ceramic conductor 76 then may be connected to receiver 80. Optionally, short, low resistance conductors analogous to connections 72, 78 in FIGS. 5 and 6 may be inserted between the driver 70 and glass ceramic conductor 76 or glass ceramic conductor 75 and receiver 80 if desired or necessary for purposes of assuring alignment.

Figure 9:
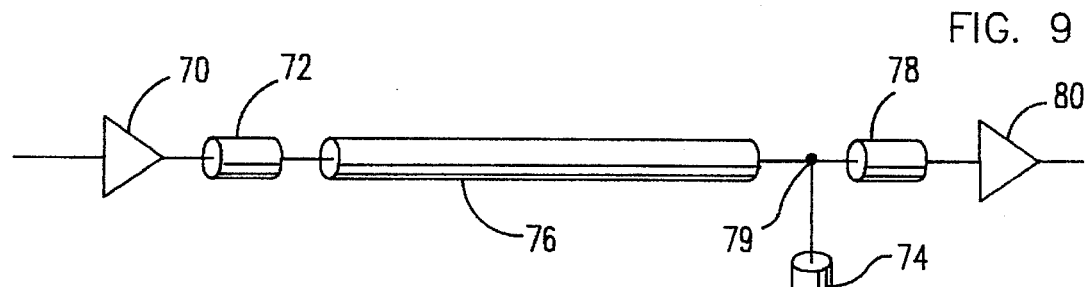
FIG. 9 is an illustration of an interconnection circuit for connecting a terminal on a first electronic chip to a terminal on a second electronic chip, designated NET 5 in FIG. 2, using far end parallel termination wherein the resistor is connected to a ground plane.

FIG. 9 illustrates the connection of a grounded thin-film resistor 74 (layer 44) connected to the node 79 between the glass ceramic conductor 76 (layer 40) and receiver 80. This termination is a parallel, far end termination and is shown in FIG. 2 as NET 5.

Figure 10:
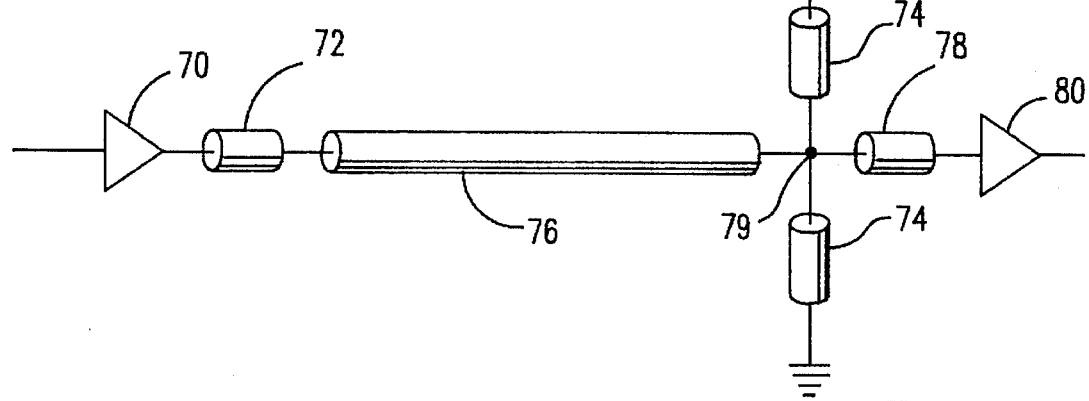
FIG. 10 is an illustration of an interconnection circuit for connecting a terminal on a first electronic chip to a terminal on a second electronic chip, designated NET 6 in FIG. 2, using split parallel termination.

FIG. 10 illustrates a connection designated as NET 6 in FIG. 2 wherein a driver 70 typically resident within chip A is connected to a glass ceramic transmission path 76, which corresponds in turn with conductive layer 16 in FIG. 2; additionally at the point where the glass ceramic conductor 76 terminates, a thin-film resistance 74 (layer 32) is connected on each side of the conductive node 79 joining conductor 76 (layer 16) and receiver 80. The resistor 74 (layer 32) is connected to $V_{DD}$ (layer 12) and ground (layer 22) providing for a split termination or parallel termination of the NET.

Figure 11:
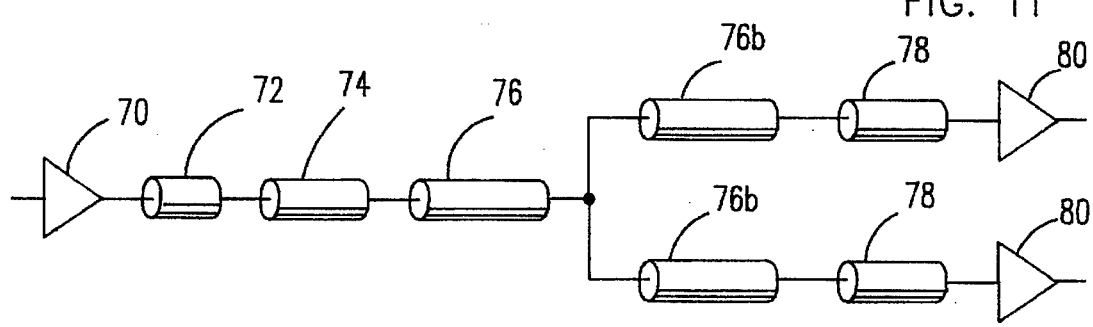
FIG. 11 is an is an illustration of an interconnection circuit for connecting a terminal on a first electronic chip to terminals on a second electronic chip, designated NET 7 in FIG. 3 forming a multi-drop circuit.

NET 7 of FIG. 3 is diagrammatically shown as FIG. 11. NET 7 is a multi-drop NET providing multiple (two) outputs. Driver 70 is connected to low resistance, thin-film connection 72 (layer 52) and thence to high resistance conductor 74 (layer 44). Conductor 74 is further connected to low resistance conductor 76 (layer 26) which branches into low resistance conductors 76b (layer 40). Each end of conductor 76b (layer 40) then is connected to conductor 78 (layer 54) for connection to receivers 80 within chip B. The above approach, using near end termination, may be used to accommodate larger numbers of branches or drops if desired.

Figure 12:
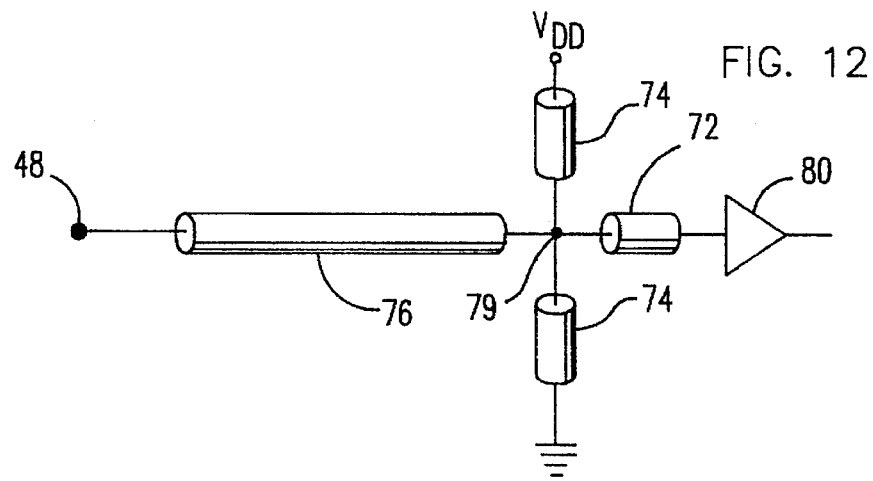
FIG. 12 is an is an illustration of an interconnection circuit for connecting a terminal on a first electronic chip to a multi-chip module output pin using split termination, designated as Net 8 in FIG. 3.

FIG. 12 shows a split termination arrangement for a circuit connecting a receiver 80 in chip A to a chip module pin connection 48. Pin 48 is connected to a low resistance conductor 76 (layer 26) and thence to a node 79. Node 79 provides connections to resistors 74 which correspond to layer 44 and connection 72 (layer 52). The ends of layer 44 are tapped and connected to ground plane 22 and to $V_{DD}$ (power layer 12).

In FIGS. 5, 6, 8, 9, 10 and 11 conductors 72 (layer 52) and 78 (layer 54) may be provided to permit alignment of the terminals of the chips A and B and connection through low resistance thin-film conductors 52, 54.

The value of the specific termination resistances introduced into the NETS by use of the thin-film resistors are determined and controlled to provide the proper termination characteristics to the circuits. Since the thicknesses of all the conductive layers are substantially uniform, the length being determined in large part by the necessary displacement between chips, the width of the conductive paths is the primary controllable variable and can be readily determined to provide the desired resistances for termination.

The foregoing description has in some instances been directed to the use of the thin-film technology in forming the low resistance conductors and integral termination resistors internal to the multi-chip module. It should be recognized that the conductors and the resistors fabricated using varied resistance conductive pastes to form the patterns on the green sheets prior to firing result in the same quality as those fabricated using the thin-film technology. Where thin films are referred to conductors and resistors formed using the high and low resistance pastes may be substituted.

As can be seen from an understanding of the foregoing, the problems of terminating the respective NETS by placing resistors at the interface between the chips and the multi-chip module are overcome by using thin-film or high resistivity paste technology to dispose the termination resistors internally to the multi-chip module. This serves the requirement of reserving surface space for interconnecting the chips to the modules while at the same time being able to precisely and accurately control the circuit by introducing into the circuit the appropriate termination resistance values.

We have described varying embodiments of our invention illustrating its utility in a number of different circuits and connections between processor chips on a multi-chip module; and accordingly, other termination connections using thin-film resistors within the multi-chip module and other minor variations of the invention may be made by one of skill in the art without removing the resulting devices from the scope of the invention as defined by the claims appended hereto.

We claim:

1. A circuit interconnecting terminals on at least two electronic chips comprising:
   a ceramic chip module comprising a support for electronic chips and for circuits interconnecting said electronic chips;
   a first low resistance conductive path supported by and at least partially external to said ceramic chip module and in electrical contact with a terminal on one of said chips;
   a second low resistance conductive path supported by and at least partially external to said ceramic chip module and electrically connected to a terminal of another of said chips;
   a third low resistance conductive path, internal to a ceramic chip module, electrically connected to said first conductive path;
   a high resistance conductive path internal to said ceramic chip module forming a resistor internal to said ceramic chip module, connected to said third low resistance conductive path and extending to and connected to said second low resistance conductive path,
   whereby the circuit may be tailored in its electrical characteristics while at the same time eliminating the need for electronic tailoring components on the surface of said ceramic chip module.

2. The circuit of claim 1 wherein each of said conductive paths are disposed on an insulative substrate.

3. The circuit of claim 2 wherein each of said conductive paths are disposed on said separate insulative substrates and said insulative substrates are stacked and fired into a solid block.

4. The circuit of claim 3 wherein said block encloses said high resistance conductive path.

5. The circuit of claim 4 wherein said low and high resistance conductive paths are deposited thin-film conductors.

6. The circuit of claim 4 wherein said low and high resistance conductive paths are residue of a paste deposited on said insulative layer.

7. A circuit incorporated into and on a ceramic module for connecting a driver to a terminal comprising:
   a first conductor;
   a second conductor, both said first and second conductors connected in series and said first conductor being a low resistance conductive path forming a portion of a transmission line and said second conductor having a predetermined high resistance relative to said first conductor;
   each of said conductors formed on a pre-ceramic sheet, and all said pre-ceramic sheets assembled and fired to form a ceramic module,
   thereby providing resistance termination of a transmission line with the characteristic impedance of said transmission line, with said resistance termination encapsulated within said ceramic module and eliminating the need for termination resistors to be mounted on the surface of said ceramic module.

8. The circuit of claim 7 wherein said conductors are the fused residue of conductive pastes deposited in patterns on said ceramic sheets.

9. The circuit of claim 8 wherein said relative high resistance of said one of said conductors is controlled by defining the width of said conductor to form a resistor terminating said circuit.

10. The circuit of claim 9 wherein said paste residue forming said high resistance conductor comprises a mixture of metal particles and ceramic material, whereby the resistance of said conductors is partially controlled.

11. The circuit of claim 7 wherein said resistor formed by said high resistance conductor is disposed internally to a chip module supporting at least an electronic chip, said electronic chip comprising said driver, said chip module further comprised of a plurality of ceramic layers and electrically conductive layers, said ceramic layers and said conductive layers fused into a monolithic structure.

12. An interconnection circuit connecting a driving terminal on a first electronic chip supported on a ceramic module to a driven terminal on a second electronic chip supported on said ceramic module comprising:
   said ceramic module having a plurality of ceramic layers fused into a unitary ceramic structure, at least a plurality of said layers having interleaved layers of conductive material therebetween and via connections electrically connecting said layers of conductive material and said terminals through at least one of said ceramic layers;
   said driving terminal connected to said driven terminal by at least two of said vias and at least two of said conductive layers, one of said vias connected to one of said conductive layers and the other of said at least two of said vias connected to said other of said at least two of said conductive layers, said at least two of said conductive layers electrically connected, one of said conductive layers comprising a high resistance conductor disposed on one of said plurality of ceramic layers and between juxtaposed ceramic layers and forming a termination resistor internal to said ceramic module.

13. The interconnection circuit of claim 12 where said resistor internally disposed within said module forms a connection with another of said at least two conducting layers by said vias.

14. The interconnection circuit of claim 12 wherein said connection electrically connects said resistor with said another of said at least two of said conducting layers in series.

15. The interconnection circuit of claim 12 wherein said high resistance conductor formed termination resistor is connected between said conductive layer and a ground layer within said ceramic module.

16. The interconnection circuit of claim 12 wherein said resistor formed is connected between said conductive layer and a power layer within said ceramic module.

17. The interconnection circuit of claim 13 where said resistor is connected between said conductive layer and a power layer within said ceramic module and a second conductor connected between said conductive layer and a ground layer within said ceramic module.

18. A circuit for connecting a driver on a first chip to at least two receivers on a second chip, both said chips supported by and electrically connected through said circuit incorporated into a ceramic module having a plurality of ceramic layers fused into a unitary structure comprising;

a low resistance conductor, said low resistance conductor branching to form at least two conductive paths, said low resistance conductor disposed on a first ceramic surface and overlaid by a ceramic layer;

a high resistance conductive path connected to said low resistance conductor and said driver, said high resistance conductive path disposed on a second ceramic surface and overlaid by a ceramic layer;

a pair of low resistance terminal pads disposed on the exterior surface of said ceramic module and connected to said two low resistance conductive paths and a receiver on said second chip connected to each said terminal pads;

a low resistance terminal pad disposed on the exterior surface of said ceramic module and connected to said high resistance conductive path and a driver terminal on said first chip connected to said terminal pad connected to said high resistance conductive path;

said high resistance conductive path disposed internally to said fused structure of ceramic layers, said structure supporting said first and second chips.

19. An interconnection circuit connecting a receiver terminal on an electronic chip to a pin connection on a ceramic module comprising:

said ceramic module having a plurality of ceramic layers, at least a plurality of said layers having interleaved therebetween layers of conductive material and having via connections electrically connecting said layers of conductive material and said terminal and said pin connection;

a terminal pad disposed on an exterior surface of said ceramic module and connected through a via connection to a first one of said layers of conductive material;

said receiver terminal connected to said pin connection by at least two of said via connections and at least one of said conductive layers; at least a second conductive layer comprising a high resistance conductor disposed on a face of a ceramic layer and encapsulated within said ceramic module and forming a termination resistor internal to said ceramic module, and said termination resistor interconnecting one of said via connections to a ground or a power source, said first conductive layer and said second conductive layer electrically connected.

* * * * *